United States Patent [19]
Hosono et al.

[11] 3,989,099
[45] Nov. 2, 1976

[54] VAPOR COOLING DEVICE FOR SEMICONDUCTOR DEVICE

[75] Inventors: Isamu Hosono; Yoshiro Shikano, both of Amagasaki, Japan

[73] Assignee: Mitsubishi Denki Kabushiki Kaisha, Tokyo, Japan

[22] Filed: Mar. 17, 1975

[21] Appl. No.: 559,392

[30] Foreign Application Priority Data
Mar. 16, 1974  Japan.............................. 49-30488

[52] U.S. Cl.......................... 165/80; 165/105; 174/15 HP; 317/100; 357/82
[51] Int. Cl.².......................................... H01L 23/46
[58] Field of Search ................ 165/105, 80; 357/82; 317/100; 174/15 HP

[56] References Cited
UNITED STATES PATENTS

| | | | |
|---|---|---|---|
| 3,476,175 | 11/1969 | Plevyak............................. | 165/105 |
| 3,609,991 | 10/1971 | Chu et al...................... | 165/105 XR |
| 3,633,665 | 1/1972 | France et al........................ | 165/105 |
| 3,653,433 | 4/1972 | Scharli................................ | 165/80 |
| 3,741,292 | 6/1973 | Aabalu et al. ...................... | 165/105 |

FOREIGN PATENTS OR APPLICATIONS 791,491  3/1958  United Kingdom................ 165/105

*Primary Examiner*—Albert W. Davis, Jr.
*Attorney, Agent, or Firm*—Wenderoth, Lind & Ponack

[57] ABSTRACT

A plurality of semiconductor elements alternating in compressive contact relationship hollow heat dissipation blocks are disposed below a coolant reservoir filled with a condensible coolant in its liquid phase having a liquid surface. The hollow blocks are connected to the reservoir through respective connection tubes to be filled with the liquid coolant. A condenser is disposed above the reservoir. One auxiliary tube is disposed within each connection tube and has an upper open end located below the liquid surface and short of a point where a condensed coolant from the condenser flows into the reservoir and a lower end opening within the associated block.

5 Claims, 6 Drawing Figures

VAPOR COOLING DEVICE FOR SEMICONDUCTOR DEVICE

CROSS REFERENCE TO RELATED APPLICATIONS

Reference is made to the following copending U.S. patent applications:

Ser. No. 557,892 entitled "Vapor Cooling Device" filed by T. Suzuki and Y. Shikano on Mar. 12, 1975 and assigned to the same assignee as the present application.

Ser. No. 559,393 entitled "Vapor Cooling Device for Electric Device", filed by G. Kobayashi and Y. Shikana on Mar. 17, 1975 and assigned to the same assignee as the present application.

BACKGROUND OF THE INVENTION

This invention relates to improvements in a cooling device for a semiconductor device utilizing the heat transfer due to boiling of a condensible coolant such as FREON (trade mark).

It is well known that cooling systems utilizing the heat transfer resulting from boiling of the condensible coolant are distinctively excellent in cooling characteristics as compared with cooling systems employed for long time to cool electric devices. Recently there are being developed cooling devices for electric devices utilizing the high heat transfer due to boiling. For example, U.S. patent application Ser. No. 557,892 entitled "Vapor Cooling Device", filed by T. Suzuki et al. on Mar. 12, 1975 and assigned to the same assignee as the present application discloses a vapor cooling device comprising a coolant reservoir filled with an amount of a condensible coolant in its liquid phase, a plurality of semiconductor elements alternating in compressive contact relationship hollow heat dissipation blocks and disposed below the coolant reservoir, one connection tube for connecting the coolant reservoir to each of the hollow heat dissipation blocks to fill it with the liquid coolant, and a condenser disposed above the coolant reservoir to be put in fluid communication with the latter. Also U.S. patent application Ser. No. 559,393 entitled "Vapor Cooling Device For Electric Device", filed by G. Kobayashi et al. on Mar. 17, 1975 and assigned to the same assignee as the present application teaches an auxiliary tube disposed within a connection tube for connecting a coolant reservoir with a condensible coolant in its liquid phase to a coolant container filled with the liquid coolant acting as a heat dissipation block and having both ends opening in the reservoir and container respectively.

In vapor cooling devices for semiconductor devices produced by incorporating the teachings of the last-mentioned application into vapor cooling devices disclosed in the first-mentioned application, the auxiliary tube has been used only to supply the liquid coolant to the hollow heat dissipation block resulting in a great improvement in cooling characteristic. However it has been found that a change in quantity of heat generated by the semiconductor elements may vary the temperature distribution of the liquid coolant adjacent to the upper open ends of the auxiliary tubes so that that portion of the liquid coolant filling any one or more of the heat dissipation blocks can boil without heat applied thereto accompanied by boiling of the liquid coolant passing through the associated auxiliary tube or tubes, and hence the formation of bubbles therein. Under these circumstances, it would become difficult to supply the liquid coolant to that heat dissipation block in which the coolant is boiling leading to a danger that the liquid coolant becomes insufficient in amount within such a heat dissipation block.

Accordingly it is an object of the present invention to avoid this danger.

It is another object of the present invention to provide a new and improved vapor cooling device for a semiconductor device distinctively excellent in cooling capability.

SUMMARY OF THE INVENTION

There is provided a vapor cooling device for a semiconductor device comprising a coolant reservoir having an amount of a condensible coolant in the form of a liquid phase charged therein including a liquid surface within the reservoir, a plurality of heat dissipation blocks disposed below the coolant reservoir including respective hollow spaces therein, one connection tube for connecting the coolant reservoir to each of the heat dissipation blocks to fill the hollow space in the associated heat dissipation block with the coolant in its liquid phase, a plurality of semiconductor elements alternating in compressible contact relationship the heat dissipation blocks to be cooled through boiling of those portions of the liquid coolant disposed in the hollow spaces, a condenser disposed above the coolant reservoir to be put in fluid communication with the latter, the condenser cooling the coolant in its vapor phase from the hollow spaces in the heat dissipation blocks entered thereinto to condense the coolant into its liquid phase, the condenser returning the coolant condensed into its liquid phase back to the coolant reservoir below the liquid surface of the coolant, and one auxiliary tube disposed within the connection tube including an upper end opening in the coolant reservoir below the liquid surface of the coolant and a lower end opening in the hollow space in the associated heat dissipation block. According to the principles of the present invention, there is provided means for supplying to the auxiliary tubes that portion of the liquid coolant located adjacent to an inflow port through which the condensed coolant from the condenser is returned back to the coolant reservoir.

Preferably each of the auxiliary tubes may be extended to locate the upper open end thereof adjacent to the inflow port.

Alternatively, a return member closed at one end may be disposed within the coolant reservoir below the liquid surface of the coolant and include the other end opening adjacent to the inflow port, while each of the auxiliary tube has the upper open end communicating with the return tube.

BRIEF DESCRIPTION OF THE DRAWINGS

The present invention will become more readily apparent from the following detailed description taken in conjunction with the accompanying drawings in which.

Throughout the Figures like reference numerals designate the identical or similar components.

DESCRIPTION OF THE PREFERRED EMBODIMENTS

Figure 1:
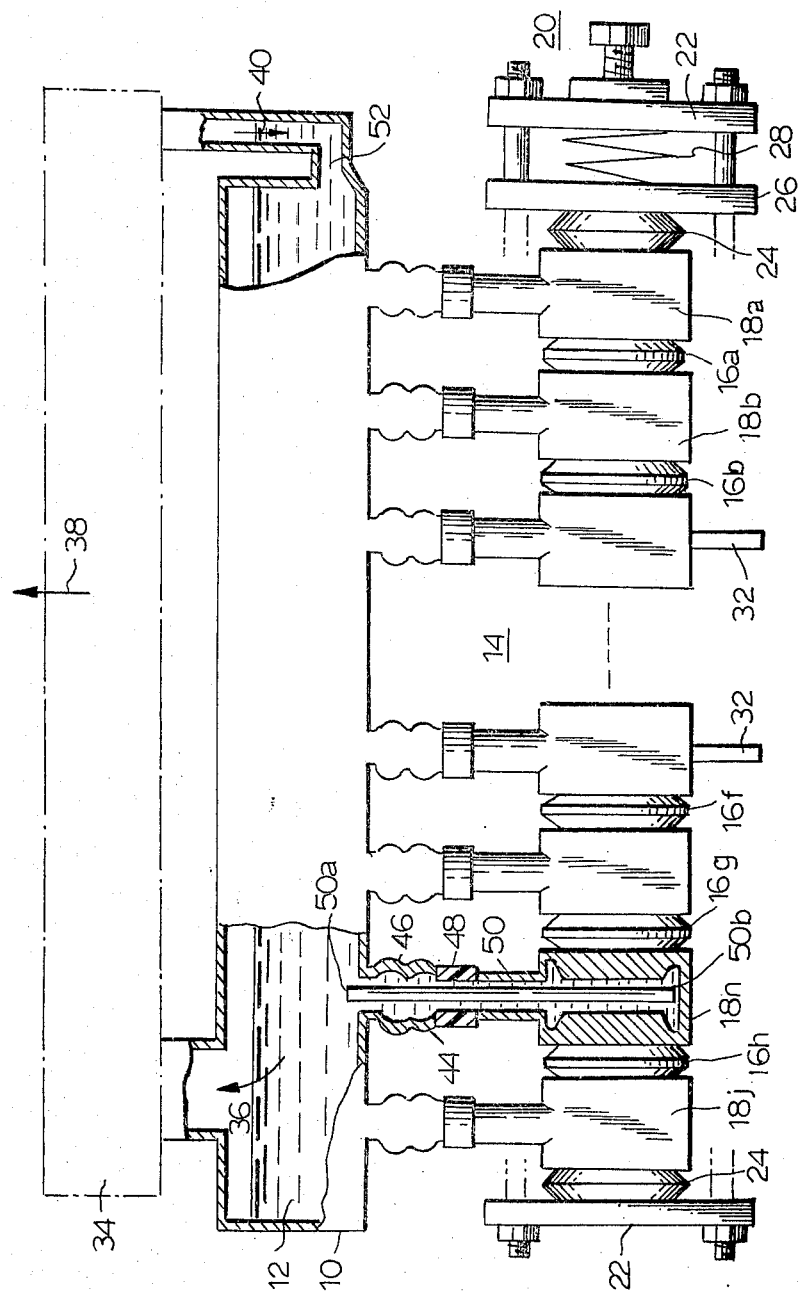
FIG. 1 is a replica of FIG. 2 of the accompanying drawings of the cited U.S. application Ser. No. 557,892 filed by T. Suzuki et al. additionally showing one auxiliary tube disclosed in the cited U.S. application Ser. No. 559,393 filed by G. Kobayashi et al.

Referring now to the drawings and FIG. 1 in particular, there is illustrated a vapor cooling device for a semiconductor device embodying the principles of the above cited U.S. patent application Ser. Nos. 557,892 and 559,393. The arrangement illustrated comprises a coolant reservoir 10 having an amount of a condensible coolant in the form of a liquid phase 12 charged therein to leave a space in the upper portion thereof, and a rectifier stack 14 formed of a plurality of semiconductor elements 16a, 16b, . . . , 16g, and 16h alternating in a compressive contact relationship heat dissipation blocks 18a, 18b, . . . , 18h and 18j in the form of flat plates and a fastening mechanism 20 including electrically insulating seats 24 and a compression spring 28 to maintain the semiconductor elements and heat dissipation blocks in a unitary structure. The stack 14 is disposed below the coolant reservoir 10 and each of the heat dissipation blocks 18a, . . . , 18j includes therein a hollow space 42 communicating with the coolant reservoir 10 through one connection tube 44 including a flexible tube portion 46 in the form of a bellows and an electrically insulating tube portion 48. Thus the hollow spaces 42 in the heat dissipation blocks and the connection tubes 44 are fully filled with the liquid coolant 12. A condenser 34 is disposed above the coolant reservoir 10 to be put in fluid communication with the latter.

Further information may be found in the cited U.S. application Ser. No. 557,892. That application is incorporated herein for reference.

According to the principles of the cited U.S. application Ser. No. 559,892, one auxiliary tube 50 is coaxially disposed within each connection tube 44 and includes an upper end 50a opening below the surface of the liquid coolant 12 within the reservoir 10 and a lower end 50b opening adjacent to the bottom of the hollow space 42 in the associated heat dissipation block. Further information is found in the cited U.S. application Ser. No. 559,892. That application is also incorporated herein for reference.

In operation the liquid coolant 12 filling the hollow space 42 in each of the heat dissipation blocks boils to form its vapor phase 36 due to heat generated by the adjacent semiconductor elements. The coolant in its vapor phase 36 ascends along the associated connection tube 44 to enter the coolant reservoir 10. Within the reservoir 10 the coolant in its vapor phase 36 from all the heat dissipation blocks 18a, . . . , 18h is collected into a vapor phase 36'. This vapor phase 36' is passed to the condenser 34 through one of ducts, in this case, a lefthand duct as viewed in FIG. 1 and then cooled with a stream of secondary coolant 38 such as the air to be condensed into its liquid phase 40. The condensed coolant 40 is returned back to the coolant reservoir 10 through the righthand duct to be mixed with the liquid coolant 12 within the reservoir 10. The righthand duct is opened in the coolant reservoir 10 below the surface of the liquid coolant 12 to form an inflow port 52.

In the arrangement of FIG. 1, it is noted that within each of the heat dissipation blocks the liquid coolant continues to boil into its vapor phase 36 that is, subsequently moved upwardly through the associated connection tube 44 while at the same time the liquid coolant 12 from the reservoir 10 is continuously supplied to the interiors of the heat dissipation blocks through the respective auxiliary tubes 50.

However it has been found that the arrangement of FIG. 1 has the following disadvantage: while the stream of secondary coolant 38 condenses the coolant into its liquid phase 40 within the condenser 34 the same can also supercool the condensed coolant 40 to a temperature Te less than its saturation temperature Ts as definitely determined by both a pressure in the particular coolant system and the saturated vapor pressure curve with the condensed coolant maintained in its liquid phase. The condensed coolant 40 at the temperature Te is heated with the coolant in its vapor phase 36 or the coolant in its liquid phase 12 blown up from the heat dissipation blocks resulting in the occurrence of temperature gradients in the liquid coolant 12 disposed within the coolant reservoir 10. For example, assuming that the auxiliary tubes 50 operatively coupled to the heat dissipation blocks 18a, 18b, . . . , 18h, and 18j has respective temperatures of Ta, Tb . . . Th and Tj adjacent to upper open ends thereof where Ta<Tb< . . . Tj is held, those portions of the liquid coolant having their temperatures of Ta, Tb, . . . and Tj are supplied to the heat dissipation blocks 18a, 18b, . . . and 18j through the auxiliary tubes 50 respectively. Thus, the boiling of the liquid coolant is most ready to occur within the heat dissipation block 18j located nearest to an outflow port through which the coolant in its vapor phase 36' passes to the condenser 34 while the boiling is most difficult to occur within the heat dissipation block 18a farthest remote away from the outflow port.

Under these circumstances, if a load (not shown) for the rectifier stack 14 decreases then the coolant system tends to lower in temperature. This tendency of the coolant system cooperates with different thermal time constants of various portions thereof to transiently change the temperature distribution in the liquid coolant 12 located within the coolant reservoir 10 until some portion of the liquid coolant 12 within the reservoir 10 may have a temperature higher than the saturation temperature Ts. For example, assuming that the temperature distribution has been changed to hold the relationship $$Te<Ta< \ldots <Ts< \ldots <Tj,$$

that portion of the liquid coolant having, for example, the temperature Tj is extremely ready to boil so that that portion of the liquid coolant 12 disposed within the heat dissipation block 18j will boil without heat applied thereto.

The boil phenomenon just described may appear with the liquid coolant returned back to each of the heat dissipation blocks, in this case, the heat dissipation block 18j. Through the associated auxiliary tube 44. This means that the liquid coolant becomes difficult to be supplied to the interior of the block 18j until a danger will be reached that the liquid coolant is insufficient within that block.

The present invention contemplates to eliminate the disadvantage as above described.

Figure 2:
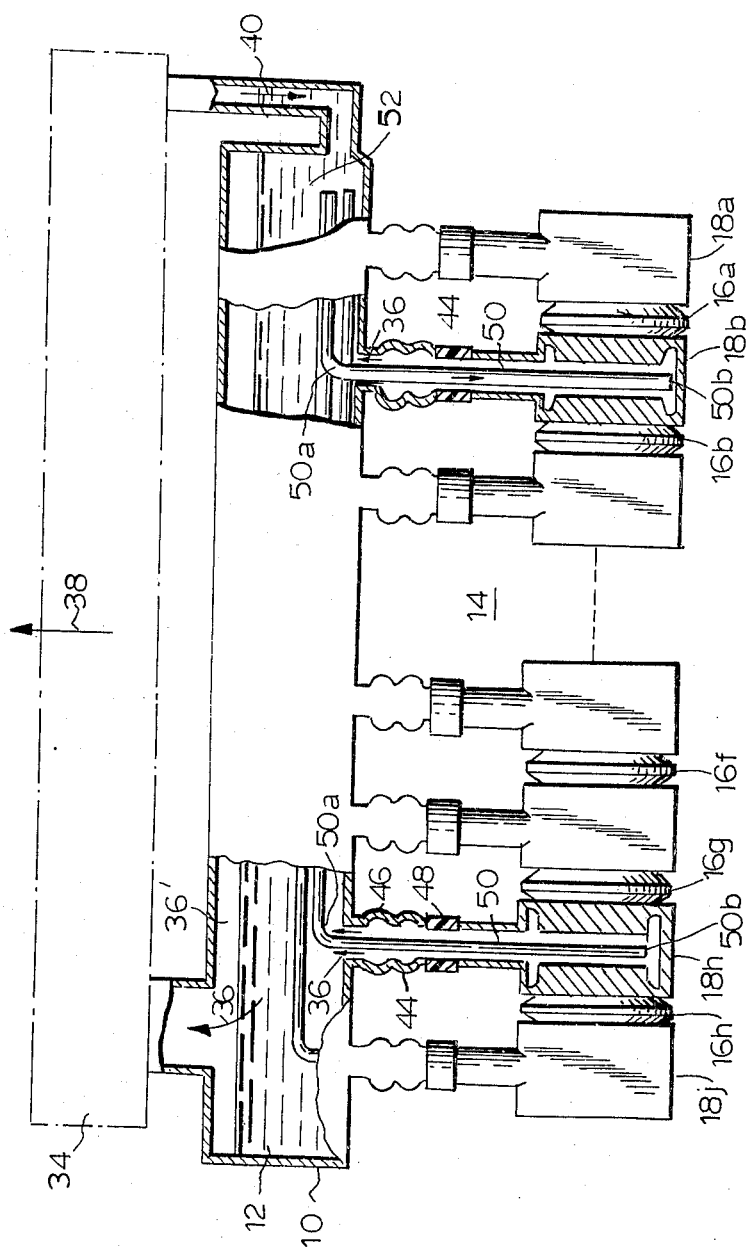
FIG. 2 is a fragmental elevational view, of a vapor cooling device for a semiconductor device constructed in accordance with the principles of the present invention with parts broken away.

Referring now to FIG. 2, there is illustrated a vapor cooling device for a semiconductor device constructed in accordance with the principles of the present invention. The arrangement illustrated is different from that shown in FIG. 1 only in that in FIG. 2, all the auxiliary tubes 50 includes respective portions disposed within the coolant reservoir 10 to run substantially in parallel to one another and to the bottom wall surface of the reservoir 10 adjacent thereto until they terminate at 50a short of the inflow port 52 through which the condensed coolant 40 from the condenser 34 is returned back to the reservoir.

The arrangement of FIG. 2 is substantially identical in operation to that shown in FIG. 1. Since the auxiliary tubes 50 includes the upper open ends 50a located short of the inflow port 52 for the condensed coolant, all the auxiliary tubes 50 are supplied with the condensed liquid supercooled to the temperature Te less than the saturation temperature Ts within the condenser 34. A decrease in a load for the rectifier stack 14 causes the tendency for the coolant system to decrease in temperature but the saturation temperature Ts is always maintained higher than or equal to the decreased temperature Te because the condensed coolant 40 is supercooled after it has been formed by condensing the coolant in its vapor phase 36'. This ensures that boiling is prevented from occurring within any of the auxiliary tubes 50 resulting in the stable cooling characteristic.

Figure 3:
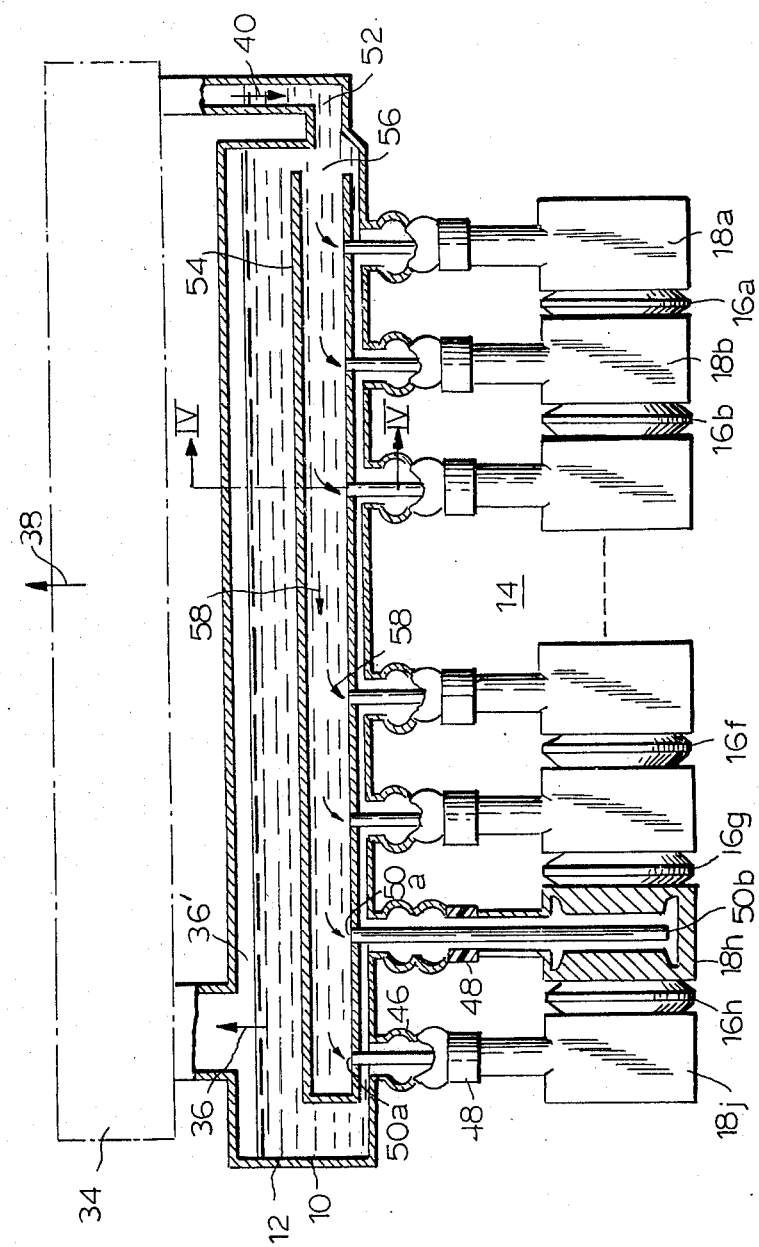
FIG. 3 is a fragmental elevational view, partly in section of a modification of the present invention with parts broken away.

An arrangement as shown in FIG. 3 includes a single circular return tube 54 relatively large in inside diameter and running in a direction substantially parallel to the bottom wall surface of the reservoir 10 adjacent thereto and over the substantial portion thereof. The return tube 54 is closed at one end and has the other end 56 opening short of the inflow 52. All the auxiliary tubes 50 have the upper open ends 50a communicating with the return tube 52 at the bottom.

As in the arrangement of FIG. 2, the supercooled liquid coolant 40 is supplied to the return tube 54 through the open end 56 thereof to be introduced into the hollo spaces 42 in the heat dissipation blocks through the respective auxiliary tubes 50 as shown at the arrow 58 in FIG. 3.

Figure 4:
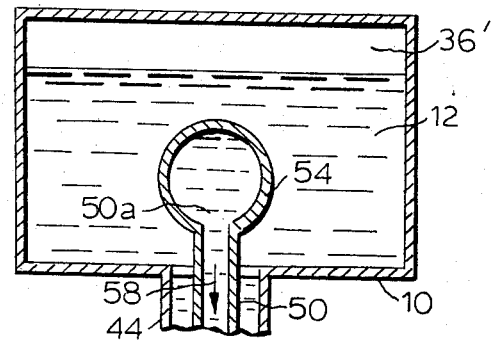
FIG. 4 is a sectional view taken along the line IV—IV of FIG. 3.
Figure 5:
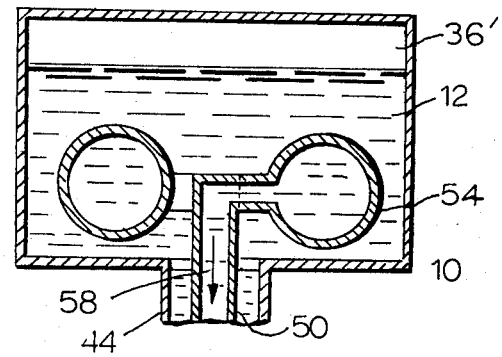
FIGS. 5 and 6 are views similar to FIG. 4 but illustrating different modifications of the present invention.

FIG. 5 shows a pair of return tubes 54 similar to the return tube 54 illustrated in FIGS. 3 and 4 juxterposed with each other. Alternating ones of the auxiliary tubes 50 have upper end portions bent in one direction to be parallel to the bottom wall surface of the reservoir 10 and opening at 50a in the adjacent return tube 54 while the remaining auxiliary tubes 50 have upper end portions bent in the opposite direction and opening at 50a in the other return tube 54. In other respects the arrangement is identical to that shown in FIGS. 3 and 4.

In the arrangement of FIG. 5 the auxiliary tubes 50 may be divided into a pair of groups in any desired pattern. Then the auxiliary tubes 50 of one of the groups may communicate with one of the return tubes 52 while those of the other group communicate with the remaining return tube 54 in the same manner as shown in FIG. 5.

Figure 6:
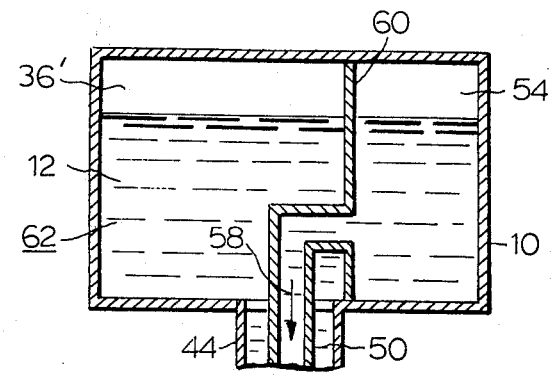

In an arrangement as shown in FIG. 6, a barrier plate 60 longitudinal traverses across the interior of the coolant reservoir 10 to form a pair of compartments 54 and 62 with the associated wall portions of the reservoir 10. The compartment 54 communicates with all the auxiliary tubes 50 through openings disposed on the barrier plate 60 and has the inflow port 52 (not shown in FIG. 6) opening therein providing the return tube. It will readily be understood that the coolant in the vapor phase from the heat dissipation blocks is passed through the compartment 62 to the condenser 34.

From the foregoing it will be appreciated that the present invention has provided vapor cooling devices for semiconductor devices simple and inexpensive in construction while performing the stable vapor cooling operation.

While the present invention has been illustrated and described in conjunction with a few preferred embodiments thereof it is to be understood that numerous changes and modifications may be resorted to without departing from the spirit and scope of the present invention.

What we claim is:

1. A vapor cooling device for a semiconductor device comprising, in combination, coolant reservoir means having an amount of a condensible coolant in the form of a liquid phase charged therein including a liquid surface within said reservoir, a plurality of heat dissipation blocks disposed below said coolant reservoir means including respective hollow spaces therein, one connection tube member for connecting said coolant reservoir means to each of said heat dissipation blocks thereby to fill said hollow space in the associated heat dissipation block with said coolant in its liquid phase, a plurality of semiconductor elements in compressive contact relationship between adjacent heat dissipation blocks for being cooled through boiling of those portions of said liquid coolant disposed in said hollow spaces, condenser means disposed above said coolant reservoir means and in fluid communication with the latter, said condenser means cooling the coolant in its vapor phase from said hollow spaces in said heat dissipation blocks entering thereinto to condense said coolant into its liquid phase, liquid return means connected between said condenser means and said coolant reservoir and having a coolant inflow port in said coolant reservoir below the liquid surface of the coolant for returning said coolant condensed into its liquid phase back to said coolant reservoir below said liquid surface of the coolant, one auxiliary tube member disposed within each of said connection tube members including an upper end opening into said coolant reservoir means below said liquid surface of the coolant and a lower end opening in said hollow space in the associated heat dissipation block, and return conduit means in said coolant reservoir extending from adjacent said coolant inflow port to each of said auxiliary tube members for supplying to said auxiliary tube members that portion of said liquid coolant adjacent said inflow port through which said condensed coolant from said condenser means is returned to said coolant reservoir means.

2. A vapor cooling device for a semiconductor device as claimed in claim 1 wherein said return conduit means in said coolant reservoir comprises an extension pipe on each of said auxiliary tube members having the open end located adjacent to said inflow port.

3. A vapor cooling device for a semiconductor device as claimed in claim 1 wherein said return conduit means comprises a return tube member closed at one end and disposed within said coolant reservoir means below said liquid surface of the coolant and having the other end opening adjacent to said inflow port, each of said auxiliary tube members having said upper open end communicating with said return tube member.

4. A vapor cooling device as claimed in claim 1 wherein said return conduit means comprises a plurality of return tube members closed at one end and disposed within said coolant reservoir means below said liquid surface of the coolant and having the other end opening adjacent said inflow port, different portions of the total number of auxiliary tube members having the upper open ends connected to different return tube members.

5. A vapor cooling device for a semiconductor device as claimed in claim 1 wherein said return conduit means comprises a barrier plate longitudinally traversing the interior of said coolant reservoir and extending between the top and bottom thereof for defining between said burner plate and said reservoir a return conduit, the upper ends of said auxiliary tube members extending through said barrier plate and opening into said return conduit.

* * * * *